(12) United States Patent
Carpenter (10) Patent No.: US 6,211,009 B1
(45) Date of Patent: Apr. 3, 2001

(54) MANUFACTURING A CAPACITOR ELECTRODE IN A SEMICONDUCTOR DEVICE

(75) Inventor: Craig E. Carpenter, Roseville, CA (US)

(73) Assignee: NEC Electronics, Inc., Santa Clara, CA (US)

( * ) Notice: Subject to any disclaimer, the term of this patent is extended or adjusted under 35 U.S.C. 154(b) by 0 days.

(21) Appl. No.: 09/397,541

(22) Filed: Sep. 16, 1999

(51) Int. Cl.[7] ............. H01L 21/8242; H01L 21/20; H01L 21/00

(52) U.S. Cl. ............. 438/254; 438/253; 438/396; 438/397; 438/9

(58) Field of Search ............. 438/253, 254, 438/396, 397, 9

(56) References Cited

U.S. PATENT DOCUMENTS

| | | | |
|---|---|---|---|
| 5,035,768 | * | 7/1991 | Mu et al. ............. 156/626 |
| 5,242,532 | * | 9/1993 | Cain ............. 156/626 |
| 5,395,769 | * | 3/1995 | Arienzo et al. ............. 438/9 |
| 5,573,973 | * | 11/1996 | Sethi et al. ............. 437/67 |
| 5,700,731 | * | 12/1997 | Lin et al. ............. 438/381 |
| 5,834,346 | * | 11/1998 | Sun et al. ............. 438/231 |
| 5,946,571 | * | 8/1999 | Hsue et al. ............. 438/255 |

* cited by examiner

Primary Examiner—Richard Booth
Assistant Examiner—Jennifer M. Kennedy
(74) Attorney, Agent, or Firm—Skjerven Morrill MacPherson LLP; Dale R. Cook

(57) ABSTRACT

A method for use in forming a capacitor having a hollow-cylinder electrode structure in a semiconductor device via controlled reactive etching of substantially only one semiconducting layer of a semiconductor device. In one embodiment, the device is a dynamic random access memory (DRAM) structure. In another embodiment, the device is a microprocessor.

15 Claims, 12 Drawing Sheets

MANUFACTURING A CAPACITOR ELECTRODE IN A SEMICONDUCTOR DEVICE

BACKGROUND OF THE INVENTION

1. Field of the Invention

The present invention deals, in general, with semiconductor devices.

2. Description of the Related Art

Figure 1A:
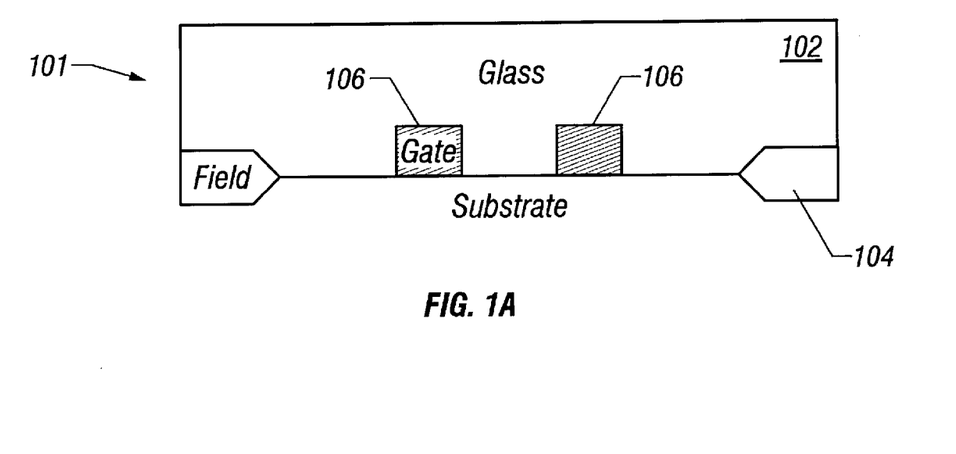
FIGS. 1A–1E introduce a first method of manufacturing a related-art capacitor electrode structure.
Figure 1B:
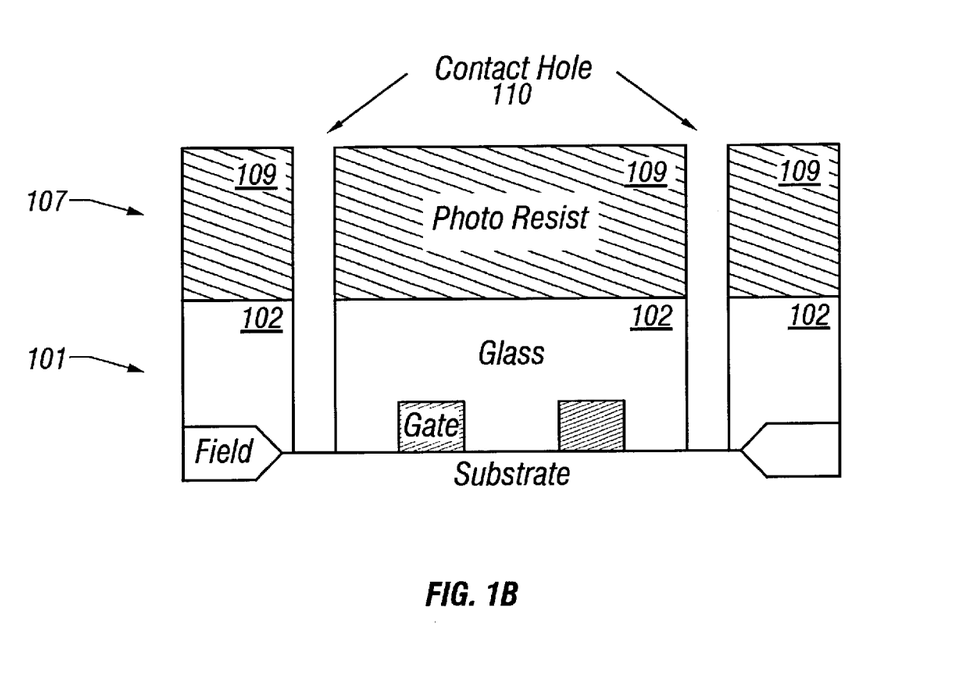
Figure 1C:
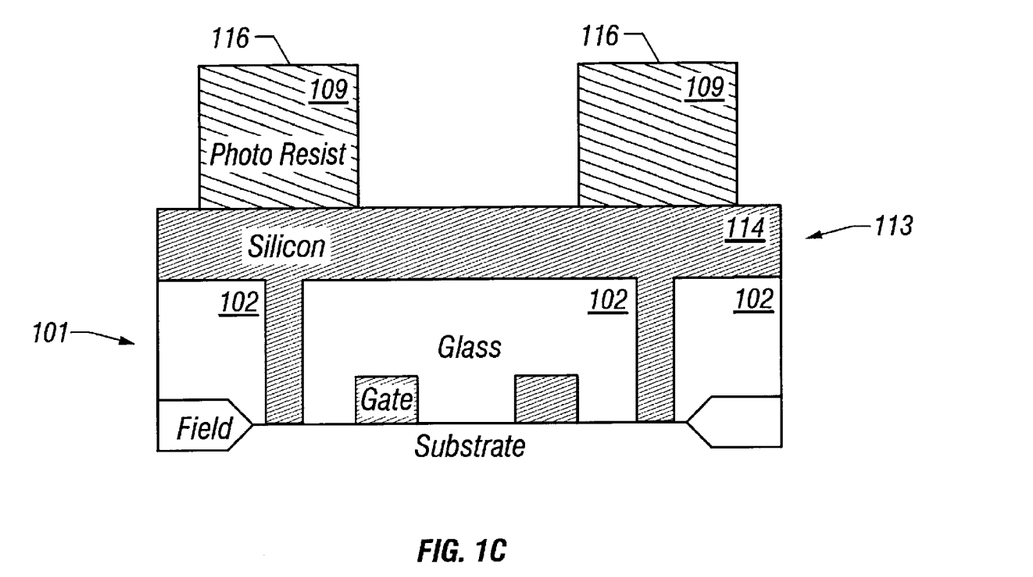
Figure 1D:
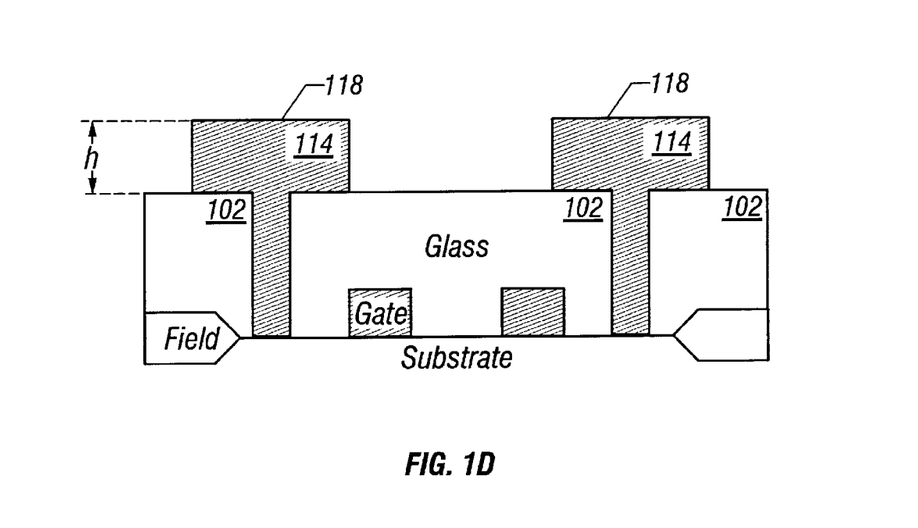
Figure 1E:
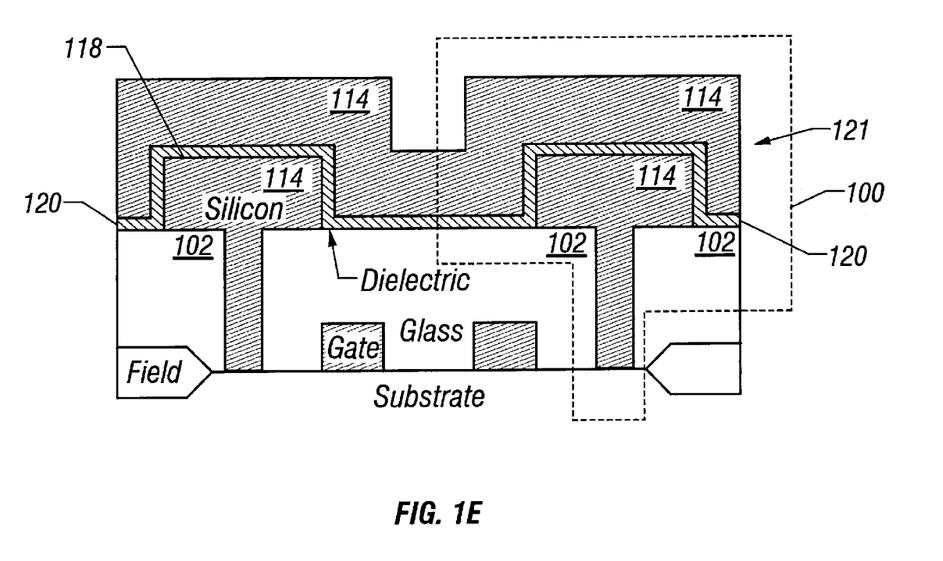

With reference to the figures, and in particular with reference now to FIG. 1E, shown is semiconductor device storage capacitor structure 100. Those skilled in the art will recognize that semiconductor device storage capacitor structure 100 is often utilized as part of integrated circuit devices such as dynamic random access memory (DRAM) cells, such as those composed of a metal oxide semiconductor (MOS) transistor and a storage capacitor (not shown), or as part of microprocessors (not shown).

Conventional techniques used to form semiconductor device storage capacitor structure 100 require the use of several discrete production tools. "Production tool" is a term of art used to indicate a stand alone machine that performs a related series of operations upon a semiconductor wafer during semiconductor device manufacturing. Those skilled in the art will recognize that each production tool typically performs only a finite number of manufacturing steps.

FIG. 1A depicts a structure typically produced by the use of a first production tool. Illustrated in FIG. 1A, formed on a silicon[1] substrate (not shown) via techniques well known in the art, are field oxide isolation region 104, gate insulating film (not shown), gate electrodes 106, and layer 101 of insulating material 102 covering gate electrodes 106. ([1]Silicon is defined herein to mean at least In situ phosphorous doped polysilicon, phosphorous deposited polysilicon, non-doped polysilicon, and amorphous silicon: consequently, reference to silicon herein is intended to encompass at least the foregoing-listed types of silicon.).

FIG. 1B shows a structure resulting from the sequential use of a second, third, fourth, and fifth production tool to modify the structure of FIG. 1A. Depicted in FIG. 1B is a structure having layer 107 of photoresist film 109 deposited on layer 101 of insulating material 102. Illustrated is that contact hole 110 has been formed to extend through layer 107 of photoresist film 109 and layer 101 of insulating material 102. Photolithography masking (hereby referred to as masking) and Reactive Ion Etching (hereby referred to as Plasma Etching) techniques are used to form contact hole 110 in a manner well known to those within the art. Contact hole 110 can be used to form electrical contact with a memory cell as described below.

FIG. 1C illustrates a structure resulting from the sequential use of a sixth, seventh, eighth, ninth, and tenth production tool to modify the structure of FIG. 1B. Shown in FIG. 1C is that layer 107 of photoresist film 109 has been removed, layer 113 of silicon 114 has been formed on layer 101 of insulating material 102, and that desired-shape mask 116 formed from photoresist film 109. Chemical Vapor Deposition (hereby referred to as CVD) is typically used to form added layer 113 of silicon 114 in a manner well known to those in the art. Desired-shape mask 116 is formed on added layer 113 of silicon 114 via a process well known to those within the art.

FIG. 1D shows a structure resulting from the use of an eleventh and twelfth production tool to modify the structure shown in FIG. 1C. FIG. 1D depicts storage capacitor solid-cylinder electrodes 118 of silicon 114. Storage capacitor solid-cylinder electrodes 118 are formed on the silicon film via plasma etching in a manner well known to those within the art. Note that in forming solid-cylinder electrodes 118 of silicon 114, desired-shape mask 116 of photoresist material 109 has been removed.

FIG. 1E depicts a structure resulting from the use of a thirteenth, fourteenth, and fifteenth production tool to modify the structure shown in FIG. 1D. FIG. 1E illustrates capacitor structure 100 where an insulating film 120 formed on the entire surface of the current structure with a subsequent layer 121 of silicon 114 being formed on insulating film 120. The subsequently formed layer 121 of silicon 114 acts as an opposing electrode to the previously developed solid-cylinder capacitor electrode 118 thus completing capacitor structure 100.

While capacitor structure 100 has proved very useful, those skilled in the art will recognize that capacitor structure 100 does have several associated disadvantages. For example, in order to achieve a larger capacitance in storage capacitor structure 100, the surface area of at least one of the opposing electrodes must be increased. In conventional memory cell structures within an integrated circuit (a typical application of capacitor structure 100), an increase in surface area is achieved by an increase in height of solid-cylinder capacitor electrode 118 (e.g., height increase 'h' as depicted in FIG. 1D). Those skilled in the art will appreciate that a primary reason electrode height is the parameter increased instead of electrode length and/or width is that space constraints in typical semiconductor devices make increases in electrode length and/or width impracticable. In addition, another disadvantage is increases in electrode height are limited by the fact that as electrode height is increased, attaining acceptable electrode profile through plasma etching becomes increasingly difficult, and the fact that increased electrode height results in severe topography[2] for following layers and processes. Such severe topography results in problems for photolithography masking and plasma etching of future layers. ([2]Topography in semiconductor terms can be defined as height difference between high and low spots on the wafer surface. It is desirable to keep height difference as small as possible. Severe topography is defined as a large height difference.)

In an effort to avoid the noted disadvantages associated with capacitor structure 100, a related-art attempt has been made to achieve increased surface area between opposing capacitor electrodes by avenues other than that of increasing a bottom electrode height of a solid-cylinder electrode 118 as was described above. The attempt has focused on changing the shape of a semiconductor device capacitor bottom electrode to that of hollow-cylinder capacitor structure 200 shown in FIG. 2F. Conventional techniques used to form semiconductor device hollow-cylinder capacitor structure 200 require use of several production tools.

Figure 2A:
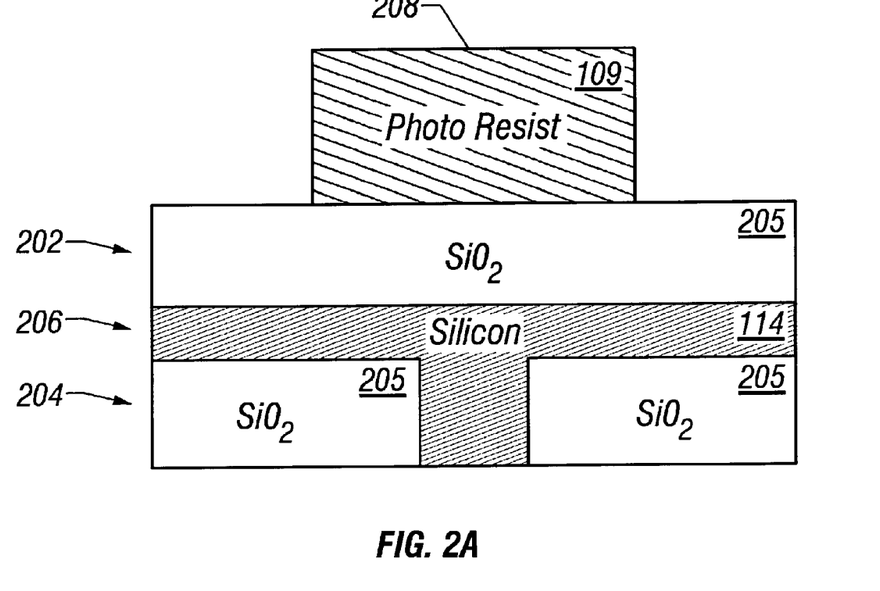
FIGS. 2A–2F introduce a second method of manufacturing a related-art alternative capacitor structure.

FIG. 2A depicts a structure typically produced by the use of a first production tool. Depicted in FIG. 2A are two layers 202, 204 of oxide 205 formed with an intermediate layer 206 of silicon 114 using CVD techniques. Illustrated is that a mask 208 of photoresist film 109 is placed above layer 202 of oxide 205.

Figure 2B:
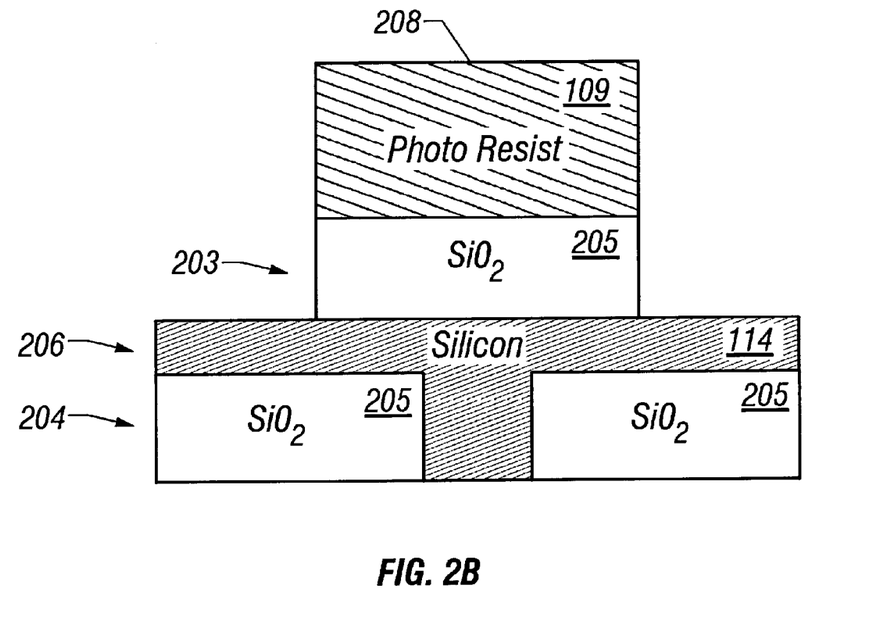

FIG. 2B shows a structure resulting from the use of a second production tool to modify the structure of FIG. 2A. Subsequent to the production of the structure shown in FIG. 2A, plasma etching techniques are used to obtain an layer 203 of oxide 205 having a desired shape as shown in FIG. 2B.

Figure 2C:
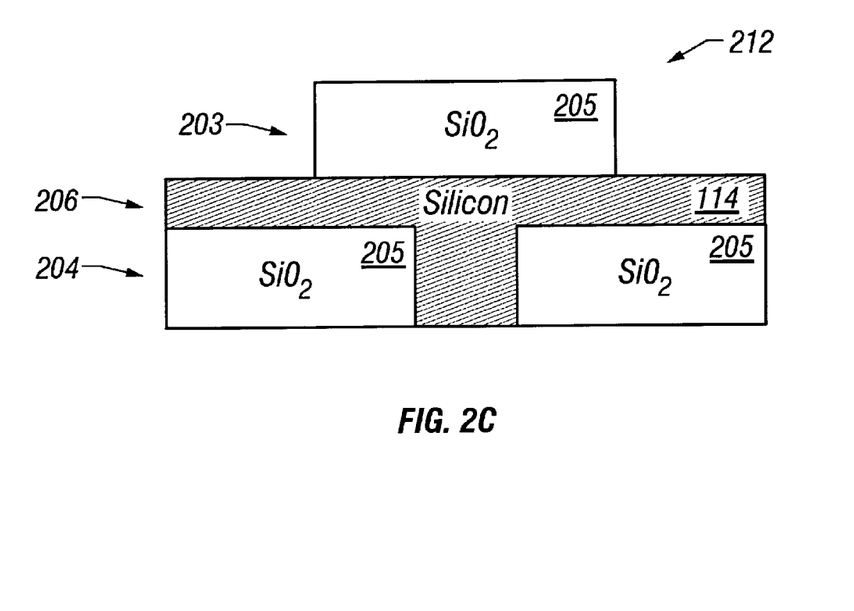

FIG. 2C shows a structure resulting from the use of a third production tool to modify the structure of FIG. 2B. Subsequent to the production of the structure shown in FIG. 2B, mask 208 of photoresist film 109 is removed leaving the structure 212 shown in FIG. 2C.

Figure 2D:
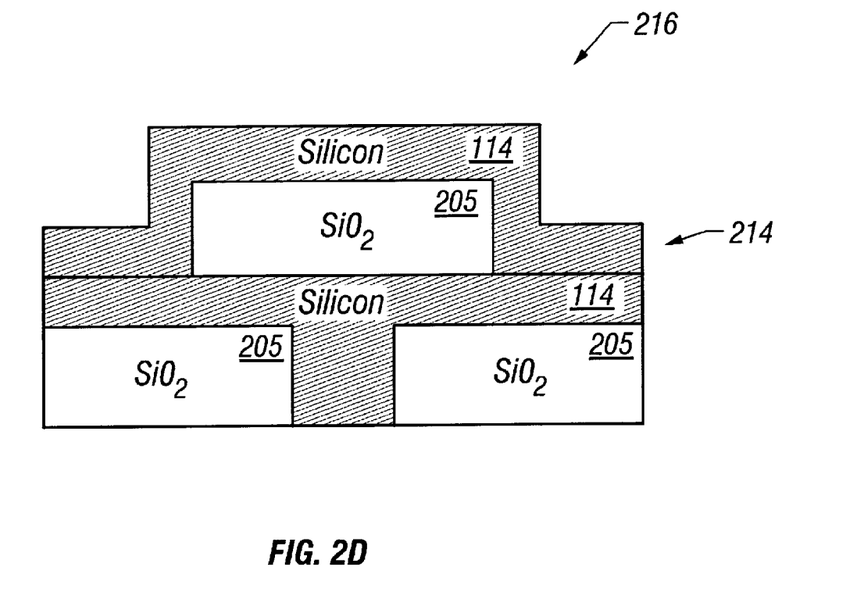

FIG. 2D shows a structure resulting from the use of a fourth production tool to modify the structure of FIG. 2C. Subsequent to the production of the structure shown in FIG. 2C, CVD techniques are used to form added layer 214 of silicon 114 on the structure 212 shown in FIG. 2C, resulting in the structure 216 shown in FIG. 2D.

Figure 2E:
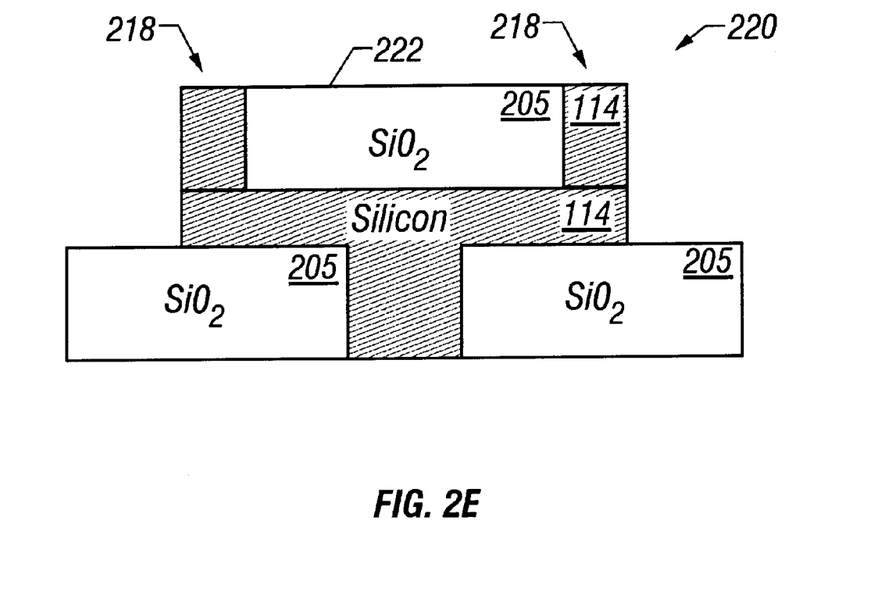

FIG. 2E shows a structure resulting from the use of a fifth production tool to modify the structure of FIG. 2D. Subsequent to the production of structure 216 shown in FIG. 2D, structure 216 shown in FIG. 2D is exposed to plasma etching which anisotropically etches flat portions of layer 214 of silicon 114 away, leaving vertical structures 218 of silicon 114 unetched and resulting in structure 220 shown in FIG. 2E. This etching process is referred to herein as an 'etch back' process.

Figure 2F:
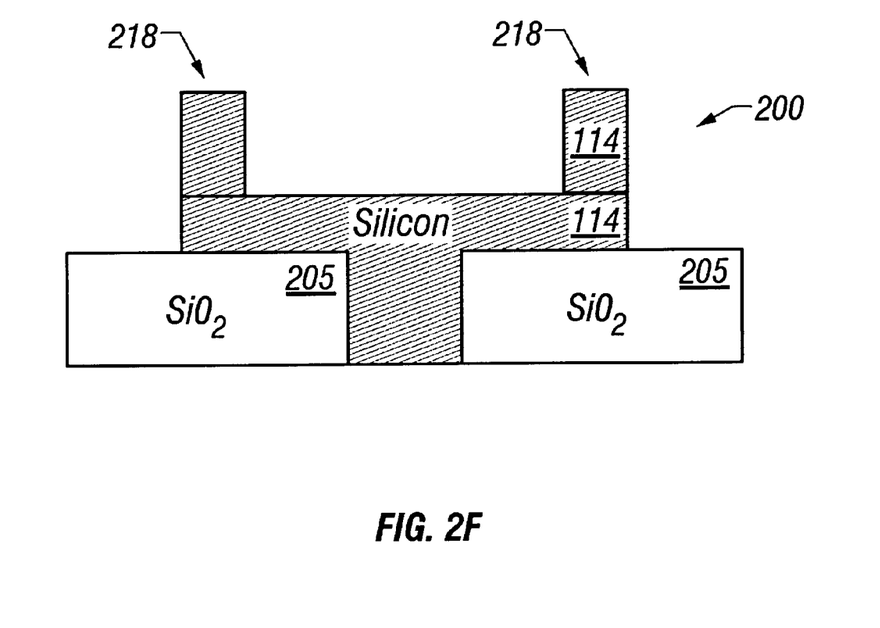

FIG. 2F shows a structure resulting from the use of a sixth production tool to modify the structure of FIG. 2E. Subsequent to the production of the structure shown in FIG. 2E, structure 220 shown in FIG. 2E is exposed to further plasma etching techniques whereby an oxide portion existing between silicon vertical section 222 (see FIG. 2E) is removed. FIG. 2F depicts the result of the further plasma etching, which is a semiconductor hollow-cylinder capacitor electrode structure 200.

Not shown, but as will be understood in the art, is that yet a seventh production tool will be utilized to construct a capacitor (not shown) from hollow-cylinder capacitor electrode structure 200 by use of an insulating film and additional silicon layer in a manner substantially analogous to that described in relation to FIG. 1E.

While hollow-cylinder capacitor electrode structure 200 does present advantages over capacitor structure 100, it also has disadvantages. For example, while the conventional method (discussed and illustrated in relation to FIGS. 1A–1E) achieves a bottom electrode shape using one plasma etch step, the alternative method (discussed and illustrated in relation to FIGS. 1A–1E) requires several plasma etch steps and several CVD steps over and above the conventional method. These additional steps make the alternative method undesirable due to additional cost associated with the process steps. Thus, while from a physical structure standpoint a capacitor constructed with hollow-cylinder capacitor electrode structure 200 is more desirable because the structure allows more surface area AND thus a high storage capacitance using the hollow-cylinder capacitor can be achieved, from a complexity of manufacturing and cost of manufacturing standpoint a capacitor constructed with solid-cylinder capacitor electrode structure 118 is more desirable.

It is therefore apparent that a need exists in the prior art for a method which will give the capability of producing hollow-cylinder capacitor electrode structure 200 with a cost and/or complexity of manufacturing comparable to or less than that associated with producing solid-cylinder capacitor electrode structure 118.

SUMMARY OF THE INVENTION

A method has been discovered which will give the capability of producing hollow-cylinder capacitor electrode structure 200 with a cost and/or complexity of manufacturing comparable to or less than that associated with producing solid-cylinder capacitor electrode structure 118. The method allows forming a capacitor having a hollow-cylinder electrode structure in a semiconductor device via controlled reactive etching of substantially only one semiconducting layer of a semiconductor device. In one embodiment, the semiconductor device is a dynamic random access memory structure. In another embodiment, the semiconductor device is a microprocessor.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

With reference to the figures, and in particular with reference now to FIGS. 3A through E, shown is a process, which utilizes only a few production tools, by which hollow-cylinder capacitor electrode structure 200 can be formed in a semiconductor device.

Figure 3A:
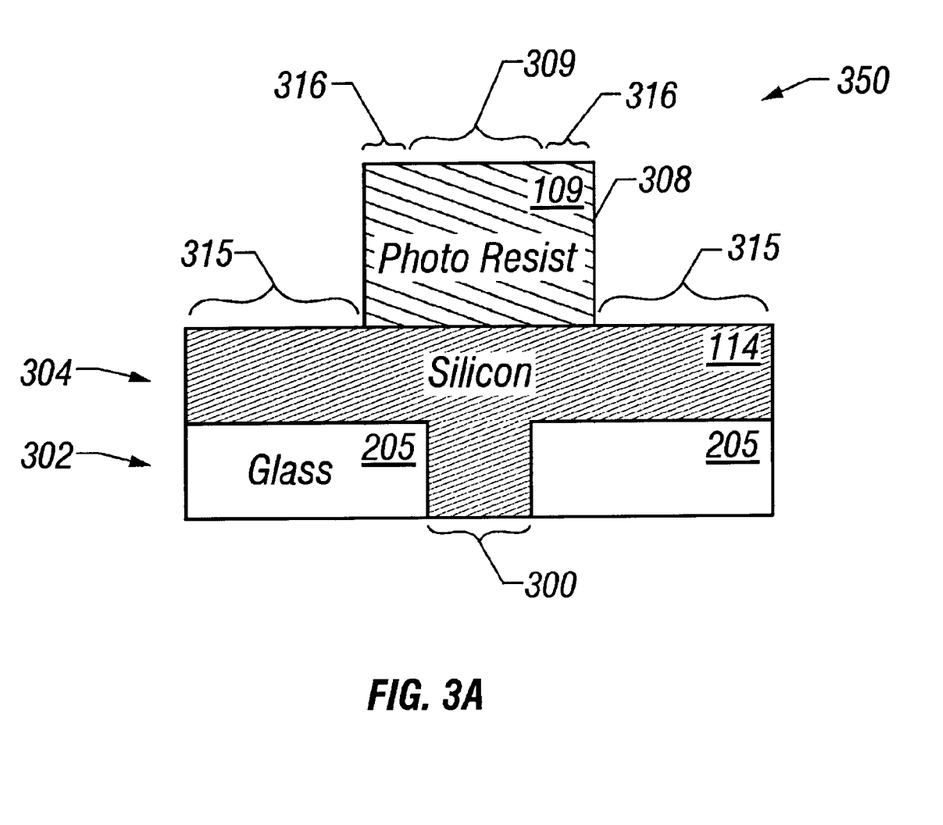
FIGS. 3A–3E introduce a third method of manufacturing an alternative capacitor structure.

Referring now to FIGS. 3A, 3B1, 3B2 3C, 3D and 3E depicted are a various structures typically produced by the use of a first production tool. Depicted in FIG. 3A is that contact hole 300 has been formed in layer 302 of insulating material 205 (e.g., boron phosphorous silicon glass or similar material) into and onto which layer 304 of silicon 114 has been placed such that contact hole 300 is filled with silicon 114. Layer 304 of silicon 114 is deposited such that layer 304 of silicon 114 has a thickness in the realm of 0.25 micron to 1.0 micron. Contact hole 300 filled with silicon 114 can be utilized in conjunction with subsequently placed silicon (not shown) to make electrical contact with underlying active regions (not shown) of a semiconductor device (not shown) via methods well known to those within the art. Layer 304 of silicon 114 is deposited using chemical vapor deposition (CVD) techniques well known to those within the art.

Illustrated in FIG. 3A is that the region above layer 304 of silicon film 114 has layer 308 of photoresist film 109, which can be applied using masking techniques well known to those within the art. Depicted is that layer 308 of photoresist film 109 is centered above contact hole 300 in layer 302 of insulating material 205, with layer 308 having dimensions greater than contact hole 300.

Figure 3B:
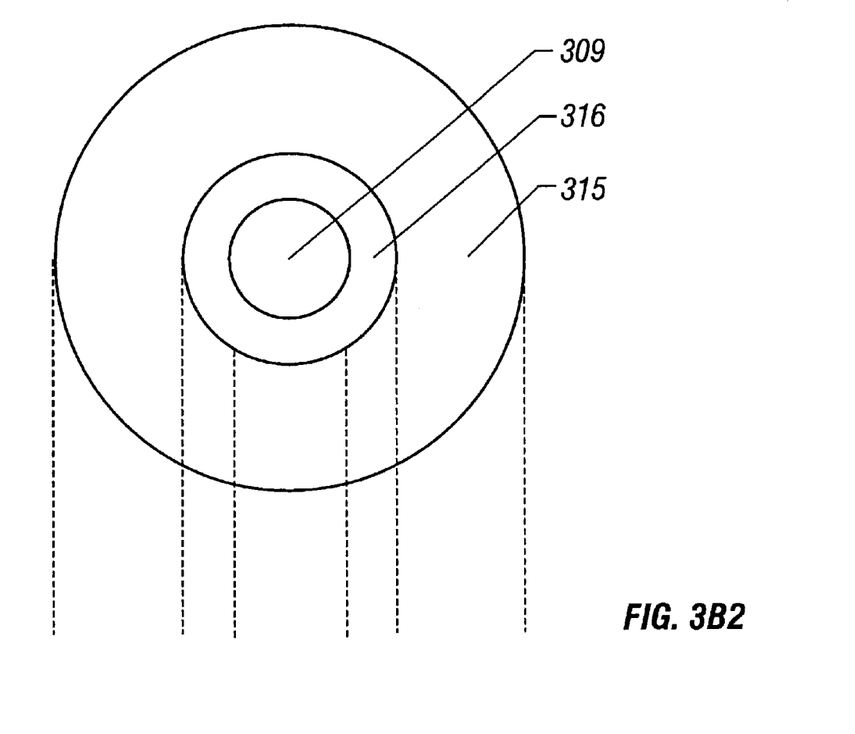
Figure 3B:
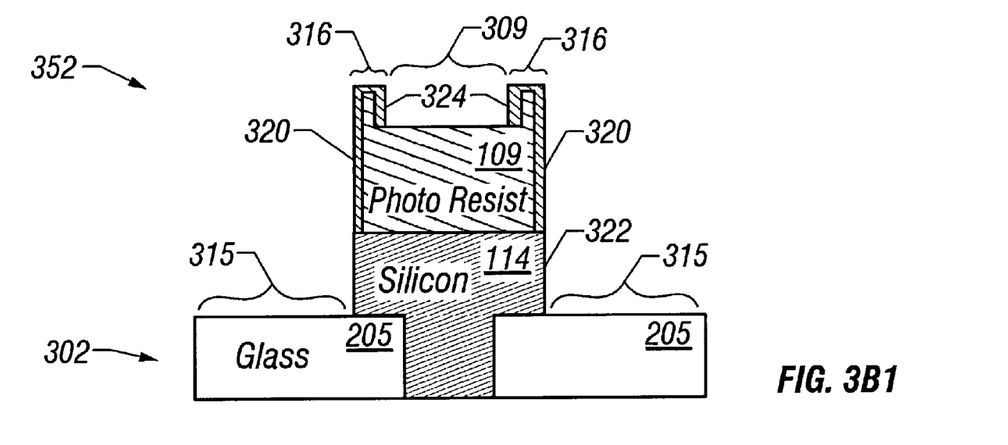
Figure 3C:
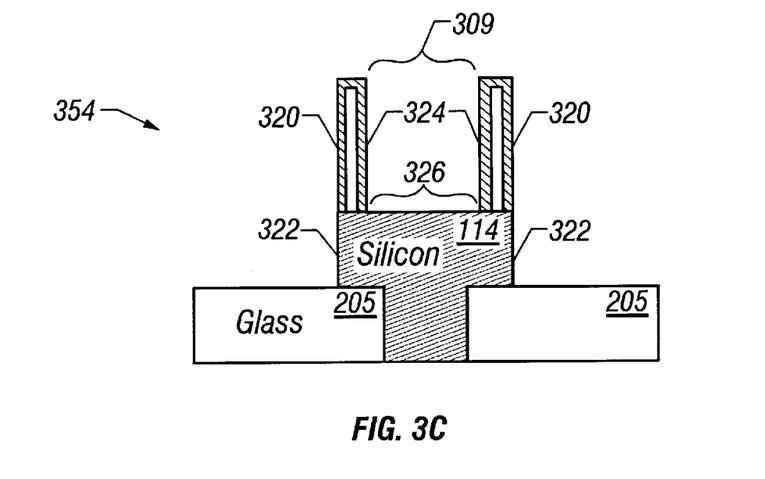
Figure 3D:
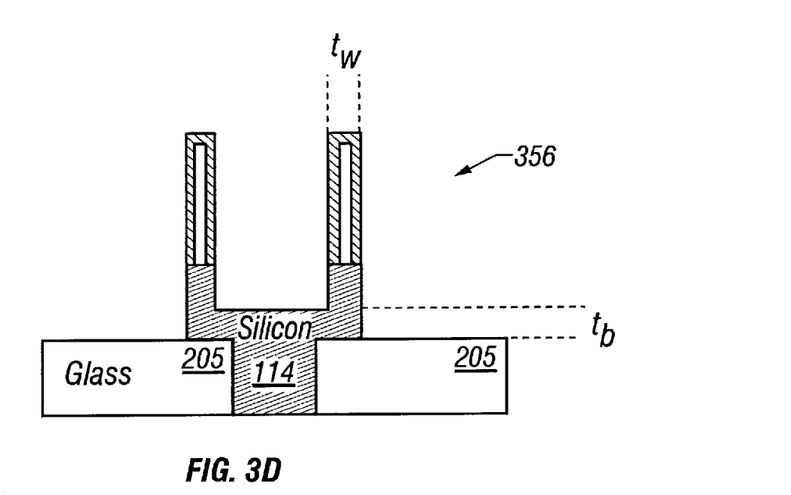

Subsequent to masking (i.e., creating mask region 316), the structure as depicted in FIG. 3A is exposed to a reactive ion etching environment (with the reactive ion environment preferably controlled in accord with a process of control discussed in relation to FIGS. 4A–4D, below). FIGS. 3B–3D show sequential "snapshots" of structure 350 depicted in FIG. 3A as that structure is exposed to reactive ion etching for longer and longer periods of time.

FIG. 3B1 shows interior region 309 of layer 308 of photoresist film 109 being removed due to continued exposure to a reactive ion etching environment. Depicted is that exterior 320 of layer 308 of photoresist film 109 and interior 324 of layer 108 of photoresist film 109 are not being removed for reasons which will be discussed below. As a result of exterior 320 and interior 324 of layer 309 of photoresist film 109 not being removed, mask region 316 is formed.

Shown in FIG. 3B2 is a top plan view looking down on mask region 316. Depicted is that mask 316 circumferentially encompasses interior region 309 of layer 308 of photoresist 109 and circumferentially excludes exterior region 315 of layer 304 of silicon 114.

Referring again to FIG. 3B1, shown is structure 352 resulting from structure 350 being exposed to reactive ion etching for a time sufficient that exterior region 315 of silicon 114, not covered by either mask region 316 or interior region 309 of photoresist film 109, has been substantially removed in a direction mostly perpendicular to a wafer (not shown) surface. Depicted is that the only areas in which silicon 114 remains are the areas where photoresist (i.e., under mask region 316 or interior region 309) is located. Those skilled in the art will recognize that because of material differences between silicon 114 and underlying layer 302 of insulating material 205, the removal rate of silicon 114 is much greater than that of the insulating material 205. Accordingly, etching effectively stops at underlying layer 302 of insulating material 205. Those skilled in the art will recognize that the foregoing can be described as anisotropic etching in that different rates of etching took place in the vertical and horizontal directions. Those skilled in the art will also recognize that substantially no undercutting of the exterior 322 of silicon 114 underlying exterior 320 of photoresist film 109 has taken place, for reasons which will be discussed below.

FIG. 3C depicts structure 354 resulting from structure 352 being exposed to a reactive ion etching environment for a time sufficient such that all photoresist film 109 in region 309 is etch ed away such that underlying region 326 of silicon 114 is exposed. Those skilled in the art will recognize that substantially no undercutting of interior 324 of photoresist film 109 has taken place, for reasons which will be discussed below.

FIG. 3D illustrates structure 356 resulting from structure 354 being exposed to a reactive ion etching environment for a time sufficient such that an optimum amount of silicon 114 has been removed (e.g., such that the thickness of the base, $t_b$ is substantially equivalent to the thickness, $t_{cw}$, of the walls of hollow-cylinder electrode 356; it has been found empirically that reactive ion etching should be stopped when remaining exposed silicon thickness is in the range of 500 to 1500 angstroms. Furthermore, silicon wall (vertical sections of silicon capacitor electrode which remain because they are covered by remaining photoresist mask) thickness should be in the range of 500 to 1500 angstroms. Overall, exposed silicon and silicon wall thickness should be similar. Again, FIG. 3D depicts such an ideal silicon capacitor electrode shape but with a remaining photoresist mask 316.

Figure 3E:
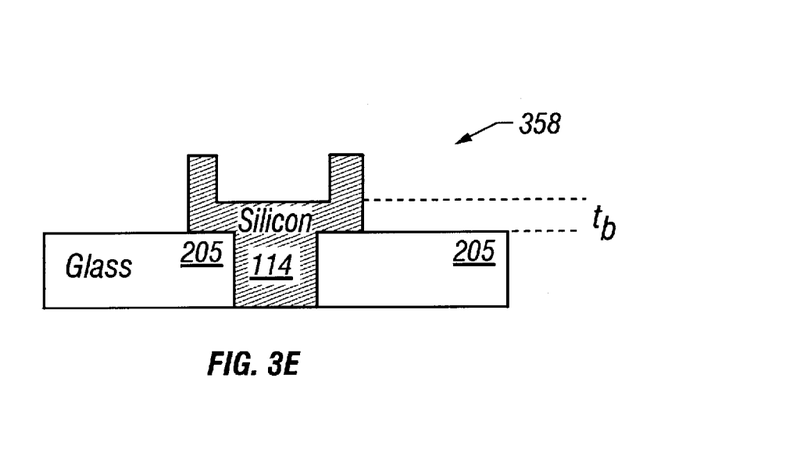

FIG. 3E illustrates structure 358 resulting from the use of a second production tool to modify structure 356 of FIG. 3D such that the remaining photoresist film of mask region 316 is removed. Structure 358 as depicted in FIG. 3D is exposed to a chemical etchant bath which consists of sulfuric acid and peroxide in specific proportions. In said chemical etchant bath, photoresist and polymer are removed from structure 356 leaving completed silicon capacitor electrode of desired hollow-cylinder structure 358 as seen in FIG. 3E.

Those skilled in the art will recognize that, in general, reactive ion etching as previously described is performed in an etching chamber (not shown) in which a silicon wafer with the structure described in FIGS. 3A–3E is mounted or placed in a given position. The etching chamber (not shown) is then evacuated to a controlled low pressure. Thereafter, specified etchant gases (not shown) are introduced in specified amounts into the evacuated environment in order to form a reactive ion etching environment. Thereafter, reactive ions (not shown) are formed within the etching chamber by applying high frequency power to a conductive electrode (not shown) mounted in the chamber. Subsequent to their formation, the formed reactive ions strike the surface of the silicon wafer on which the structure described in FIG. 3A is located, and the formed reactive ions strike the surface at an angle mostly perpendicular to wafer surface. Both silicon 114 and photoresist film 109 are removed by striking reactive ions.

In one embodiment, specific hardware configurations can be described as using a capacitively-coupled reactive ion etching system, such as the Lam Research 4400, with process parameters of a power in the range of 100W to 400W, electrode spacing in the range of 0.5 cm to 1.0 cm, pressure in the range of 100 mT to 400 mT, a total gas flow in the range of 300 sccm to 500 sccm which is comprised of 20% to 40% chlorine, 0% to 5% hydrogen bromide, 50% to 70% helium, and 0% to 5% oxygen. Such an environment gives rise to many benefits, a few of which are described below.

It was noted and described above that the etching described in relation to FIGS. 3A–3E is anisotropic and that virtually no undercutting occurs. Virtually no undercutting occurs in one embodiment because the amount of undercutting during reactive ion etching is reduced by the formation of process polymers which actually result from the byproducts of the etchant gases and etched material. These "byproduct" polymers attach themselves to the exterior vertical section 320 of photoresist film 109. These byproduct polymer protect exterior vertical section 320 of photoresist film 109 because the byproduct polymers make exterior vertical sections 320 more resistant to removal from striking reactive ions. Also, exterior vertical section 320 of photoresist film 109 serves as an "overhang" to shield exterior vertical section 322 of silicon 114 below vertical section 320 of photoresist film 109 from etching.

Similar "byproduct" polymers form on interior vertical regions 324 of the photoresist film 109. As photoresist film 109 is removed within interior region 309 of photoresist 109 (i.e., interior to mask 316) byproduct polymers form on interior vertical regions 324 created by the removal of photoresist film 109 not protected by photoresist mask 316. The overall effect may be described as digging a hole in the inner regions of photoresist film 109.

It was mentioned above that the amount of etching is dependent upon the time of exposure to the reactive ion environment. FIGS. 4A through D depict various resulting silicon capacitor electrode structures based on the amount of time the structure is exposed to reactive ion etching. FIGS. 4B through C specifically illustrate the situation of lack of accurate reactive ion etching control.

Figure 4A:
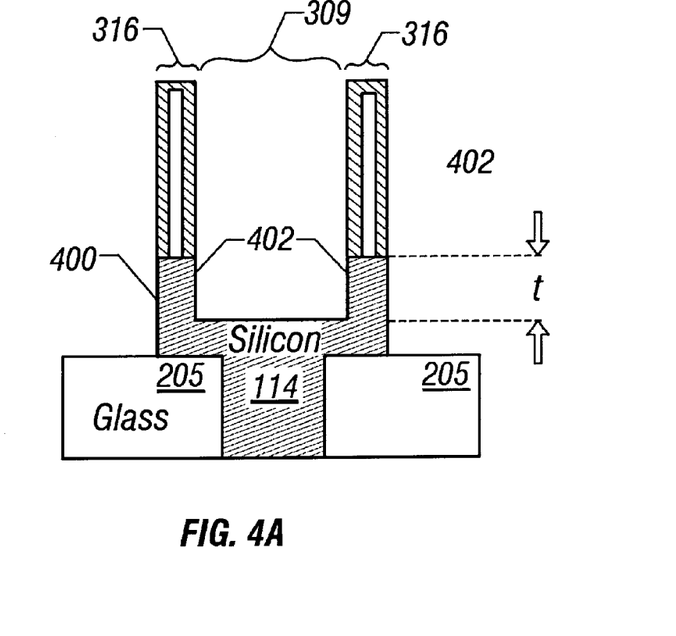
FIGS. 4A–4D show various possible resulting capacitor electrode structures associated with the control of the method of manufacturing discussed in FIGS. 3A–3E.
Figure 4B:
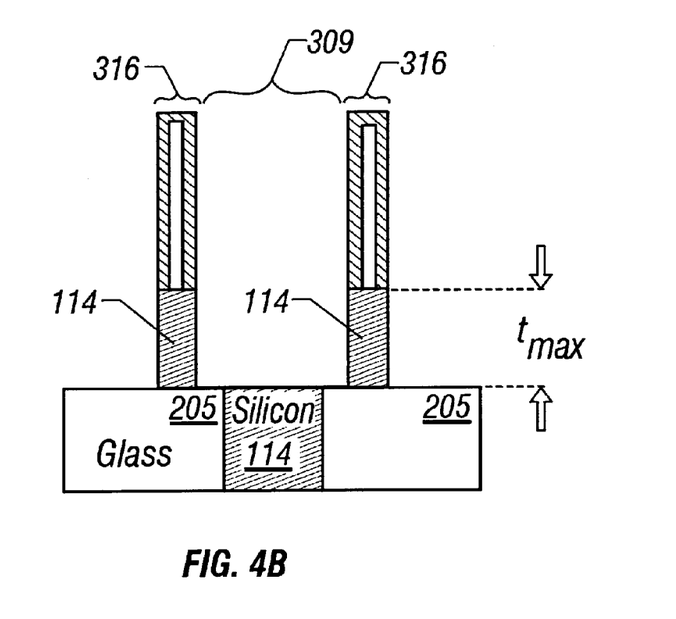
Figure 4C:
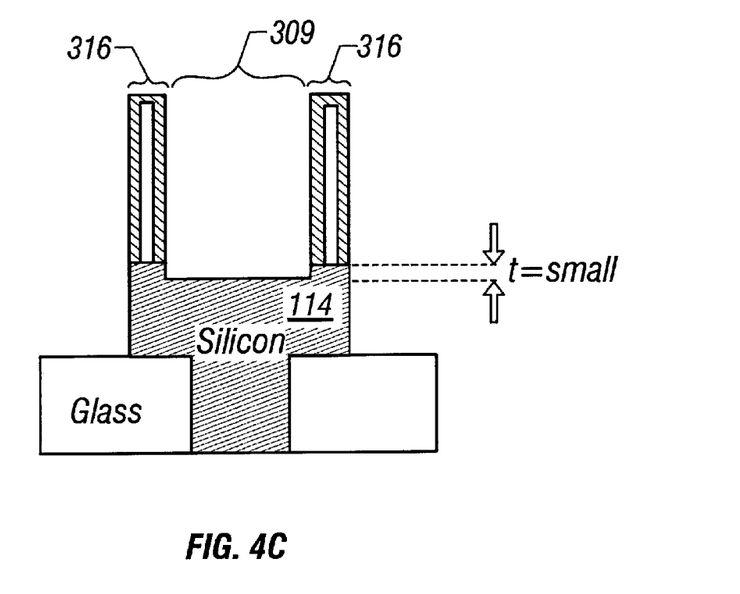
Figure 4D:
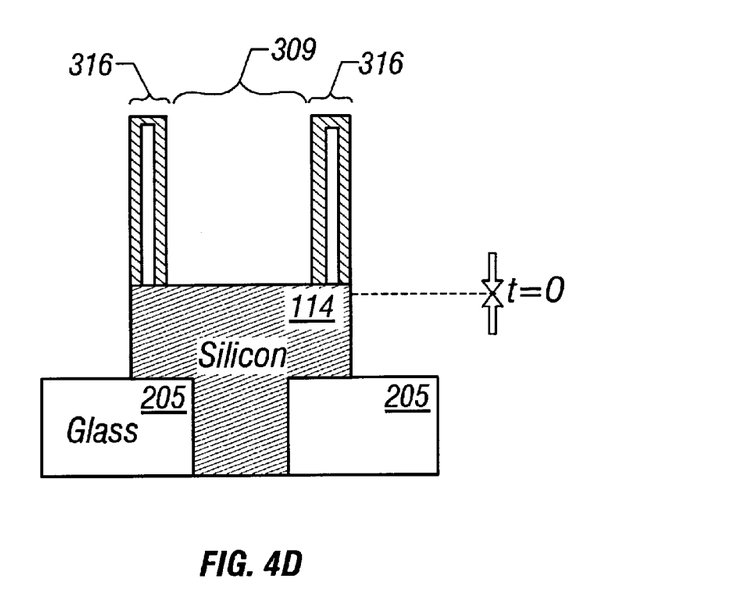

FIG. 4A shows the ideal situation which is also depicted in FIG. 3D. Shown is that bottom 400 of the silicon electrode and the walls 402 of the silicon electrode structure are of the same thickness. In the diagram of FIG. 4A; 't' represents the etching depth into silicon 114 of the interior region 309 of the capacitor electrode. FIG. 4B depicts a possible result which can occur when reactive ion etching is allowed to continue beyond when an ideal capacitor electrode structure is achieved. Shown is that 't' is at its maximum etch depth, $t_{max}$, and thus can increase no further. Semiconductor devices (e.g., dynamic random access memory) depending on this structure will not function. FIG. 4C illustrates another possible result which can occur when reactive ion etching is stopped before the ideal capacitor electrode structure is achieved. Depicted is 't'=small close to its minimum value, t=0. Although the depicted structure of FIG. 4C will perform in a dynamic random access memory semiconductor device the increased performance characteristics associated with the capacitor structure will not be as pronounced as with the structure shown in FIG. 4A. FIG. 4D shows another possible result which can occur when reactive ion etching is stopped at the moment when photoresist in inner regions of mask are clear and underlying silicon is initially exposed, t=0. The structure shown in FIG. 4D, as was the situation for the structure shown in FIG. 4C, will perform in a dynamic random access memory semiconductor device, but the increased performance characteristics will not be as pronounced as those associated with the ideal capacitor structure shown in FIG. 4A.

Thus, as is apparent from the foregoing, it is important that reactive ion etching be controlled so that near optimum electrode structures, such as those shown in FIGS. 3D and 4A, may be obtained. One way in which to achieve near optimum electrode structures is to use plasma endpoint technology to determine a near optimum time to stop the reactive ion etching.

As noted above, it has been found empirically that it is desirable to stop the reactive ion etching at the appropriate instant such that exposed silicon thickness is in the range of 500 to 1500 angstroms. A process of reactive ion etching control by which the reactive ion etching can be stopped such that the desired silicon thickness of 500 to 1500 angstroms can be achieved is described in relation to FIG. 5, following. The control process makes use of plasma endpoint technology.

Those skilled in the art will recognize that plasma endpoint technology is based on a recognition that (1) in a reactive ion etch environment etching is performed by ions, which are defined as electrically charged atoms; (2) the specific ions present in a reactive ion etching environment are a combination of specific etchant gases which have been introduced and the material(s) being etched; and (3) due to the fact that the reactive ion environment is being electrically stimulated via the use of electrical energy delivered into the reactive ion chamber by stimulation electrodes, all ions in the reactive etching environment will be intermittently emitting electromagnetic energy of a specific frequency. Utilizing the foregoing facts, plasma endpoint technology notes that the total electromagnetic energy in the reactive ion etch environment can then be characterized by looking at the energy within the full electromagnetic spectrum. Consequently, an electromagnetic detector can be utilized to monitor the intensity of electromagnetic energy of at least one given specific frequency of interest.

It has been found empirically that within a reactive ion chamber when photoresist film is completely removed and underlying material is exposed (e.g., such as occurred in the series of operations described in FIGS. 3A–3D), the amount of electromagnetic energy present at various electromagnetic frequencies changes significantly and in a predictable fashion. Accordingly, the electromagnetic energy changes at one or more chosen frequencies can be monitored using an electromagnetic energy detector, and when the noted significant and predictable changes in electromagnetic energy within the etching chamber occur, such changes can be used to terminate (either immediately or in a controlled fashion, wherein the etching is gradually decreased) the reactive etching process. In one implementation, software algorithms are utilized in conjunction with a detector such that changes in intensity (e.g., changes of a given amount, or changes occurring at a given rate), are used as a signal to stop the reactive ion etching process.

Those skilled in the art will recognize that the exact electromagnetic energy changes and frequencies used to control the etching process will vary dependent upon the etching chamber utilized, and the actual etching chamber environment utilized. Accordingly, one way to determine the exact electromagnetic energy changes and frequencies to be utilized to stop a reactive etching process within a given chamber is to engage in a trial and error etching and monitoring process, and empirically determine changes in the electromagnetic environment which occur consonant with the desired etching result (e.g., using the change in energy associated with the event of a silicon layer becoming exposed as a signal to stop or decelerate the etching process). Thereafter, the empirically deemed changes can be utilized to stop the etching process.

With respect to the processes and desired results depicted above in relation to FIGS. 3A–3E and 4A–4D, plasma endpoint technology can be utilized to determine the point at which the photoresist in inner region 309 of mask 316 is completely removed and underlying silicon 114 exposed. At this point the main etch step is ended. Thereafter, a timed etch, utilizing similar plasma endpoint technology parameters (e.g., energy at various frequencies within the electromagnetic spectrum) as the main etch, can be utilized to give the exact results desired. With this method of control the etch depth of the silicon within the inner regions of the electrode is controlled and thus the desirable electrode profile can be such that the bottom of the silicon electrode structure and silicon electrode wall are of similar thickness (e.g., such as the situation depicted in FIG. 3D or 4A). Again, the parameters to achieve this result will vary dependent upon the etching chamber and reactive etching environment and will need to be determined empirically.

Figure 5:
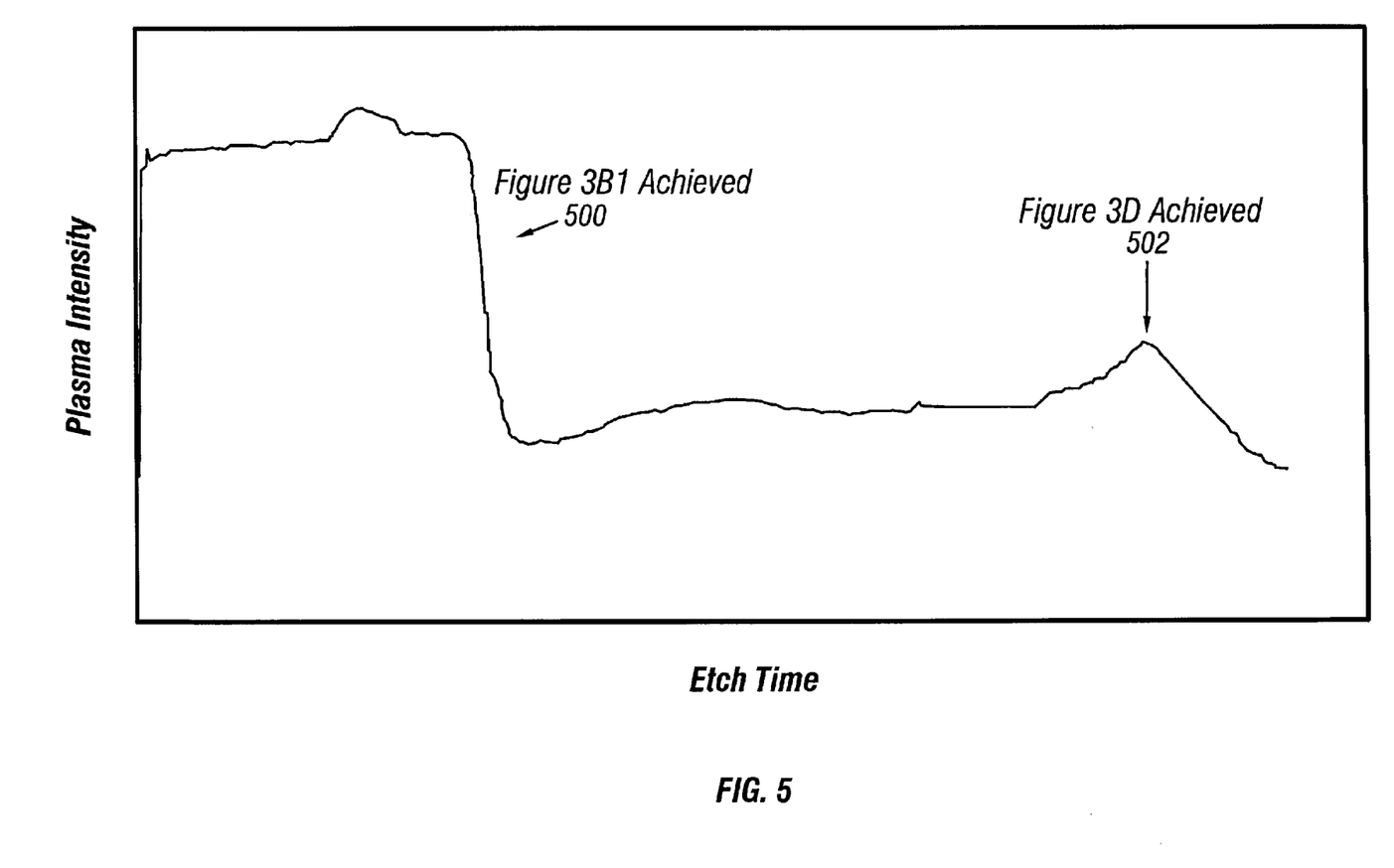
FIG. 5 represents a graph of electromagnetic energy (plasma intensity) versus reactive ion etching time which can be used to precisely control etching of a semiconductor device so that the third method of manufacturing introduced in FIGS. 3A–3E can be used effectively.

As has been noted above, using plasma endpoint technology, the intensity of electromagnetic energy at one or more specific frequencies can be monitored. By way of example, those skilled in the art will recognize that there are at least two major changes which can occur in the reactive ion etch environment which have corresponding changes in electromagnetic energy intensity. Referring now to FIG. 5, which illustrates a tracing of electromagnetic energy detected by a plasma endpoint technology detector, it can be seen that the first major change will occur when the exposed silicon—exterior region 315 of silicon 114 not covered by photoresist mask 316—is completely removed and the underlying insulating material 205 is exposed as depicted in FIG. 3B1.The absence of silicon 114 in exterior region 315 causes electromagnetic energy decrease 500. The second major change occurs when the photoresist 109 in the inner region 309 of mask 316 is completely removed and underlying silicon 114 exposed as depicted in FIG. 3C. The exposure of silicon 114 causes electromagnetic energy increase 502. These noted electromagnetic energy (plasma intensity) changes (e.g., decreases/increases) associated with the occurrences of FIG. 3B1 and FIG. 3C depicted in FIG. 5 can be used to control the reactive etching process. In one implementation, software algorithms are utilized in conjunction with a detector such that the main etch step stops when the energy increase 502 caused by the situation depicted in FIG. 3C occurs. Immediately following the main etch step a short timed etch step is utilized such that the ideal silicon capacitor electrode structure as seen in FIG. 3D is achieved. The exact time used has been determined by the trial and error process described above.

In one embodiment, using plasma endpoint technology, a detector such as one manufactured by Lam Research and used on the Rainbow 4400 reactive ion etching system, set at 403 nm monitors electromagnetic energy into a signal between 0 volts and 10 volts. Controlling software then converts the range of 0 volts to 10 volts to a range of 0 counts to 32000 counts. The initial level of monitored electromagnetic energy is then set to a desired count level by adjusting endpoint detector electronics. Using software algorithms in conjunction with endpoint detector the reactive ion etch step is controlled such that reactive ion etch stops when ideal silicon capacitor structure is realized. That is, after energy increase 502 and the empirically determined optimal time has elapsed.

Thus, as the foregoing discussion has shown, a silicon hollow-cylinder electrode capacitor can be achieved, but in such a fashion that only reactive ion etching techniques are utilized. That is, with a cost and/or complexity of manufacturing comparable to or less than that associated with producing a solid-cylinder electrode capacitor.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles used to claim elements.

In addition, even if a specific number of an introduced claim element is explicitly recited, those skilled in the art will recognize that such recitation should typically be interpreted to mean at least the recited number (e.g., the bare recitation of "two elements," without other modifiers, typically means at least two elements, or two or more elements).

What is claimed:

1. A method of manufacturing a capacitor in a semiconductor device, said method comprising:

forming a hollowed-cylinder electrode structure via controlled reactive etching of substantially only one semiconducting layer of a semiconductor device, wherein said forming a hollowed-cylinder electrode structure further includes:

substantially simultaneously (a) etching a first depth in a region external to a mask region of the substantially only one semiconducting layer, and (b) etching a second depth in a region internal to the mask region of the substantially only one semiconducting layer.

2. The method of claim 1, wherein said forming a hollowed-cylinder electrode structure via controlled reactive etching of substantially only one semiconducting layer of a semiconductor device further comprises:

etching a contact hole in at least one insulating layer; and filling the contact hole in the at least one insulating layer with a portion of the substantially only one semiconducting layer.

3. The method of claim 1, further comprising:

masking a region of the substantially only one semiconducting layer.

4. The method of claim 3, wherein said masking a region of the substantially only one semiconducting layer further comprises:

depositing a layer of photoresist film on the substantially only one semiconducting layer; and selectively removing the photoresist film such that the photoresist film remains in a region centered o n but larger than an underlying contact hole.

5. The method of claim 4, wherein said step of selectively removing the photoresist film such that the photoresist film remains in a region centered on but larger than an underlying contact hole further comprises:

exposing the layer of photoresist film to a reactive ion etching environment.

6. The method of claim 1, further comprising:

determining when said etching a second depth in a region internal to the mask region of the substantially only one semiconducting layer has resulted in an unmasking of a portion of the substantially only one semiconducting layer; and in response to said determining, terminating said etching.

7. The method of claim 6, wherein said determining when said etching a region internal to the mask region of the substantially only one semiconducting layer has resulted in an unmasking of a portion of the substantially only one semiconducting layer further comprises:

detecting at least one plasma endpoint technology signal.

8. The method of claim 7, wherein said detecting at least one plasma endpoint technology signal further comprises:

detecting at least one plasma energy increase.

9. The method of claim 6, wherein said terminating said etching further comprises:

performing a timed etching until a desired thickness of the substantially only one semiconducting layer remains.

10. The method of claim 1, wherein the semiconductor device comprises at least one dynamic random access memory cell.

11. The method of claim 1, wherein the semiconductor device comprises at least one microprocessor.

12. A method for controlling etching of semiconductor devices, said method comprising:

etching a device in a reactive ion etching chamber;

detecting electromagnetic energy at one or more electromagnetic spectrum frequencies; and     in response to the electromagnetic energy, adjusting a reactive ion etching environment in the reactive ion etching chamber wherein said adjusting a reactive ion etching environment in the reactive ion etching chamber further includes terminating said reactive ion etching and performing a timed etch until a desired thickness of substantially only one semiconducting layer remains.

13. The method of claim 12, wherein said etching a device in a reactive ion etching chamber further comprises:

introducing a reactive ion etching environment in the reactive ion etching chamber.

14. The method of claim 12, wherein said detecting electromagnetic energy at one or more electromagnetic spectrum frequencies further comprises:

detecting at least one plasma endpoint technology signal.

15. The method of claim 14, wherein said detecting at least one plasma endpoint technology signal further comprises:

detecting at least one plasma energy increase.

\* \* \* \* \*